United States Patent
Penta et al.

(10) Patent No.: US 10,787,592 B1
(45) Date of Patent: Sep. 29, 2020

(54) CHEMICAL MECHANICAL POLISHING COMPOSITIONS AND METHODS HAVING ENHANCED DEFECT INHIBITION AND SELECTIVELY POLISHING SILICON NITRIDE OVER SILICON DIOXIDE IN AN ACID ENVIRONMENT

(71) Applicant: Rohm and Haas Electronic Materials CMP Holdings, Inc., Newark, DE (US)

(72) Inventors: Naresh Kumar Penta, Newark, DE (US); Kwadwo E. Tettey, Newark, DE (US); Matthew Van Hanehem, Middletown, DE (US)

(73) Assignee: Rohm and Haas Electronic Materials CMP Holdings, I, Newark, DE (US)

( * ) Notice: Subject to any disclaimer, the term of this patent is extended or adjusted under 35 U.S.C. 154(b) by 0 days.

(21) Appl. No.: 16/413,954

(22) Filed: May 16, 2019

(51) Int. Cl.
| | |
|---|---|
| *H01L 21/67* | (2006.01) |
| *C09G 1/02* | (2006.01) |
| *H01L 21/3105* | (2006.01) |
| *B24B 37/04* | (2012.01) |

(52) U.S. Cl.
CPC .............. *C09G 1/02* (2013.01); *B24B 37/044* (2013.01); *H01L 21/31055* (2013.01)

(58) Field of Classification Search
CPC ......... H01L 21/67248; H01L 21/67086; H01L 21/67253; H01L 21/67017; H01L 21/30604; H01L 21/31055; C09G 1/02; B24B 37/044
See application file for complete search history.

(56) References Cited

U.S. PATENT DOCUMENTS

| | | |
|---|---|---|
| 8,157,876 B2 | 4/2012 | Grumbine et al. |
| 8,652,350 B2 | 2/2014 | Nishimoto et al. |
| 8,821,215 B2 | 9/2014 | Naguib Sant |
| 9,725,621 B2 | 8/2017 | Zhang et al. |
| 9,982,165 B2 | 5/2018 | Choo et al. |
| 2007/0293049 A1 | 12/2007 | Minamihaba et al. |
| 2009/0068840 A1 | 3/2009 | Minaminaba et al. |
| 2013/0244433 A1* | 9/2013 | Reiss ................ H01L 21/30625 438/693 |
| 2014/0103250 A1* | 4/2014 | Cui .................... H01L 21/3212 252/79.1 |
| 2014/0197356 A1 | 7/2014 | Minamihaba et al. |
| 2019/0092971 A1* | 3/2019 | Penta ....................... C09G 1/02 |

* cited by examiner

*Primary Examiner* — Nadine G Norton
*Assistant Examiner* — Mahmoud Dahimene
(74) *Attorney, Agent, or Firm* — John J. Piskorski

(57) ABSTRACT

Acid chemical mechanical polishing compositions and methods have enhanced defect inhibition and selectively polish silicon nitride over silicon dioxide in an acid environment. The acid chemical mechanic polishing compositions include poly(2-ethyl-2-oxazoline) polymers, anionic functional colloidal silica particles, amine carboxylic acids and have a pH of 5 or less.

8 Claims, No Drawings

CHEMICAL MECHANICAL POLISHING COMPOSITIONS AND METHODS HAVING ENHANCED DEFECT INHIBITION AND SELECTIVELY POLISHING SILICON NITRIDE OVER SILICON DIOXIDE IN AN ACID ENVIRONMENT

FIELD OF THE INVENTION

The present invention is directed to chemical mechanical polishing compositions and methods having enhanced defect inhibition and selectively polishing silicon nitride over silicon dioxide in an acid environment. More specifically, the present invention is directed to chemical mechanical polishing compositions and methods having enhanced defect inhibition and selectively polishing silicon nitride over silicon dioxide in an acid environment, wherein to the chemical mechanical polishing compositions include a poly(2-ethyl-2-oxazoline) polymer, anionic functional colloidal silica abrasive particles and an amine carboxylic acid and the pH of the chemical mechanical polishing compositions are 5 or less.

BACKGROUND OF THE INVENTION

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Certain advanced device designs demand polishing compositions that provide silicon oxide removal efficiency at lower point-of-use (POU) abrasive weight percent as well as reduced scratch defects for the improvement of polishing processes throughout and product yield %. As the size of structures on semiconductors devices continue to shrink, performance criteria which was once acceptable for planarizing and reducing defects of polishing dielectric materials becomes increasingly less acceptable. Scratches and chattermarks which were once considered acceptable are today becoming yield limiting.

As technology for integrated circuit devices advances, traditional materials such as silicon nitride, silicon dioxide and polysilicon are being used in various combinations to achieve and enable desired architectural configurations and device performance. Conventional polishing slurries have been designed for "stop on silicon nitride" applications such as in shallow trench isolation (STI). More recently, the density of integrated circuits has continued to increase, leading to new front end of the line (FEOL) structures that benefit from chemical mechanical polishing (CMP), including replacement metal gates, contact plugs, and substrates treated by conductive metallization. In such structures, silicon nitrides serve as the etch stop layer, capping material, and hard mask. In addition, silicon nitride finds increasing use as a diffusion or passivation layer, spacer material, and liner. In all such schemes, silicon nitride is used in combination with other dielectric films such as silicon oxide or tetraethoxysilane (TEOS). Thus, most patterned wafers now contain both silicon nitride and silicon dioxide dielectric films at different densities. Further, feature size steps involving such integration schemes require selective CMP polishing or removal of silicon nitride films without removing the silicon dioxide dielectric material. Other methods needing silicon nitride: silicon dioxide selective CMP polishing compositions are "Reverse STI processes" where trenches are etched in the dielectric silicon dioxide and filled with a dielectric silicon nitride cap; and alternatives to conventional "Etch Back processes" where CMP polishing is used in addition to or instead of etching. One such example of the alternative etching process is self-aligned contact (SAC) capping. In SAC capping, replacement metal gates (RMG) have been formed of an excess of metal, such as tungsten, that has been removed by CMP polishing, and then has been etched down by reactive ion etching (RIE) which forms narrow gaps in the wafer. The gaps are then filled with silicon nitride (SiN or $Si_3N_4$). CMP polishing then removes excess silicon nitride and stops on the silicon dioxide surface. In each case, new FEOL architectures like SAC require a reverse selectivity, i.e., a high silicon nitride removal rate with a low silicon dioxide oxide removal rate, in CMP polishing to remove the excess dielectric.

In SAC, complete clearing of the silicon nitride layer over existing silicon dioxide layers is critical to avoid blocking silicon dioxide etching in successive steps. However, over polishing of the silicon nitride thins the silicon nitride SAC cap, risking an electrical short. Therefore, CMP with high selectivity CMP polishing is critical. The new FEOL architectures all result in a structure in which a predetermined pattern of the dielectric silicon nitride is inlaid in the silicon wafer. Such CMP polishing requires removal and planarization of a silicon nitride overburden, thereby resulting in a coplanar surface with the silicon nitride-filled trenches, plugs, or gaps. An acceptable silicon nitride:silicon dioxide removal rate ratio is necessary to prevent damage to the underlying silicon active areas and provide an over polish margin to ensure all pattern densities are cleared of the silicon nitride.

Accordingly, there is a need for a chemical mechanical polishing composition and method which prevents damage to underlying silicon dioxide and selectively polishes silicon nitride over silicon dioxide.

SUMMARY OF THE INVENTION

The present invention is directed to an acid chemical mechanical polishing composition, comprising, as initial components:
  water;
  anionic functional colloidal silica abrasive particles;
  a poly(2-ethyl-2-oxazoline) polymer;
  an amine carboxylic acid;
  optionally, an anionic surfactant;
  optionally, a biocide; and,
  wherein a pH of the acid chemical mechanical polishing composition is 5 or less.

The present invention is further directed to a method for chemical mechanical polishing of a substrate, comprising,
  providing a substrate, wherein the substrate comprises silicon nitride and silicon dioxide;
  providing an acid chemical mechanical polishing composition comprising, as initial components:
    water;
    anionic functional colloidal silica abrasive particles;
    a poly(2-ethyl-2-oxazoline) polymer;
    an amine carboxylic acid;

optionally, an anionic surfactant;
optionally, a biocide; and,
wherein a pH of the acid chemical mechanical polishing composition is 5 or less; and,
providing a chemical mechanical polishing pad with a polishing surface;
creating dynamic contact at an interface between the polishing surface of the chemical mechanical polishing pad and the substrate with a down force of 20.7 kPa; and
dispensing the acid chemical mechanical polishing composition onto the chemical mechanical polishing pad at or near the interface between the chemical mechanical polishing pad and the substrate;
wherein the substrate is polished; and, wherein defects are inhibited and silicon nitride is selectively removed over silicon dioxide from the substrate.

The acid chemical mechanical polishing composition and method of the present invention inhibit damage to the silicon dioxide and simultaneously enable selective removal of silicon nitride over silicon dioxide in an acid environment.

DETAILED DESCRIPTION OF THE INVENTION

As used throughout this specification the following abbreviations have the following meanings, unless the context indicates otherwise: ° C.=degrees Centigrade; L=liters; mL=milliliters; µ=µm=microns; kPa=kilopascal; A=angstroms; mm=millimeters; nm=nanometers; s=seconds; min=minute; rpm=revolutions per minute; mV=millivolts; lbs=pounds; kg=kilograms; Mw=weight average molecular weight; psi=pound force per square inch; lbf=pound force; 1 kPa=0.145038 psi; wt %=percent by weight; e.g.=for example; LPCVD=low pressure chemical vapor deposition; PECVD=plasma enhanced chemical vapor deposition; RR=removal rate; pI=isoelectric point; PS=Polishing Slurry of the Invention; CS=Comparative Polishing Slurry; PEO=poly(2-ethyl-2-oxazoline) polymer; PVP=polyvinylpyrrolidone; PAAm=polyacrylamide; HF=hydrogen fluoride; and SiN or $Si_3N_4$=silicon nitride.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon oxide formed from the decomposition of tetraethyl orthosilicate ($Si(OC_2H_5)_4$). The term "isoelectric point" means the pH at which an organic acid does not migrate in an electric field or electrophoretic medium. The term "composition" and "slurry" are used interchangeably through-out the specification. The terms "a" and "an" refer to both the singular and the plural. All percentages are by weight, unless otherwise noted. All numerical ranges are inclusive and combinable in any order, except where it is logical that such numerical ranges are constrained to add up to 100%.

The chemical mechanical polishing compositions and methods of the present invention are useful for polishing a substrate comprising silicon nitride (SiN or $Si_3N_4$) and silicon dioxide (TEOS) and, wherein defects such as scratch marks (long line of damage caused to surface) and chatter marks (abrasive roll over damage) are inhibited, and silicon nitride removal rate is selective over silicon dioxide removal rate in an acid environment. The chemical mechanical polishing composition used in the method of the present invention contains (preferably consists of) water; anionic functional colloidal silica abrasive particles; one or more nonionic poly(2-ethyl-2-oxazoline) polymers, one or more amine carboxylic acids; optionally an anionic surfactant; optionally a biocide; and wherein the chemical mechanical polishing composition has a pH of 5 or less. Preferably, the pH of the chemical mechanical polishing composition of the present invention is from 2 to 5, more preferably, from 3 to 5, most preferably, from 3 to 4.

The nonionic poly(2-ethyl-2-oxazoline) polymers have weight average molecular weights of 1000 or greater. Preferably, the nonionic poly(2-ethyl-2-oxazoline) polymers have weight average molecular weights of 1000 to 1000, 000, more preferably, the poly(2-ethyl-2-oxazoline) polymers of the present invention have weight average molecular weights of 10,000 to 500,000, even more preferably, the nonionic poly(2-ethyl-2-oxazoline) polymers of the present invention have weight average molecular weights of 30,000 to 60,000, and most preferably, the poly(2-ethyl-2-oxazoline) polymers have weight average molecular weights of 40,000 to 50,000. Poly(2-ethyl-2-oxazoline) of the present invention have a general formula:

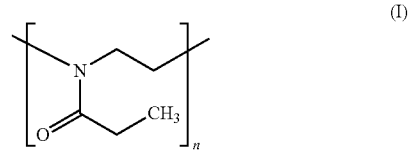

(I)

wherein "n" is an integer greater than 1, preferably, "n" is an integer of 10-10,000 or such as 10-500.

The one or more nonionic poly(2-ethyl-2-oxazoline) polymers can be included in the chemical mechanical polishing compositions of the present invention, as initial components, in amounts of 0.001 wt % or greater. Preferably, the one or more poly(2-ethyl-2-oxazoline) polymers are included in the chemical mechanical polishing compositions in amounts of 0.005 wt % to 0.25 wt %, more preferably, the one or more poly(2-ethyl-2-oxazoline) polymers are included in amounts of 0.01 wt % to 0.1 wt %, most preferably, the nonionic poly(2-ethyl-2-oxazoline) polymers are included in the chemical mechanical polishing compositions in amounts of 0.05 wt % to 0.1 wt %.

The water contained in the chemical mechanical polishing composition used in the chemical mechanical polishing method of the present invention is, preferably, at least one of deionized and distilled to limit incidental impurities.

In accordance with the chemical mechanical polishing compositions of the present invention, anionic functional colloidal silica abrasive particle compositions include, but are not limited to, a dispersion of colloidal silica particles made by conventional sol gel polymerization or by the suspension polymerization of water glass to produce a plurality of elongated, bent or nodular silica particles in a distribution or mixture that can include a plurality of spherical silica particles.

Dispersions of elongated, bent or nodular anionic functional colloidal silica particles can be made from suspension polymerization by hydrolytic condensation of silanols formed in a known manner from precursors like tetraethoxysilane (TEOS) or tetramethoxysilane (TMOS). Processes for making the elongated, bent or nodular colloidal silica particles are known and can be found, for example, in U.S. Pat. No. 8,529,787 to Higuchi et al. The hydrolytic condensation includes reacting the precursors in aqueous suspension in the presence of a basic catalyst, such as alkylammonium hydroxides, alkoxyalkyl amines, such as ethoxypropylamine (EOPA), alkylamines or potassium hydroxide, preferably, tetramethylammonium hydroxide. The elongated, bent or nodular silica particles are anionic at a pH of 5 or below.

The anionic functional groups in the one or more dispersions of colloidal silica abrasive particles can be sulfonic acid, such as is disclosed in publication WO2010134542A1. In this publication, the sulfonic acid modification of silica comprises adding to silica a silane coupling agent having a functional group which can be chemically converted into a sulfonic acid group to colloidal silica and then converting the functional group into a sulfonic acid group. For example, the silica coupling agent, 3-mercapto propyl trimethoxysilane, which has a mercapto group, a sulfide group or combination thereof can be converted to a sulfonic acid group by use of an oxidizer, such as hydrogen peroxide. Another anionic functional group on the silica surface can be a phosphonic acid group. Preferably, the colloidal silica abrasives in the chemical mechanical polishing compositions of the present invention have a zeta potential from −5 mV to −50 mV at a pH of 5 or less. Such a zeta potential helps control colloidal stability and silicon nitride to silicon oxide removal rate ratio.

Examples of commercially available bent or nodular anionic colloidal silica particles are available from Fuso Chemical Co., Ltd., Osaka, JP (Fuso) under the tradenames PL-1-D and, PL-3-D abrasive slurries.

Preferably, the colloidal silica has an average particle size of <200 nm, more preferably, 10 nm to 150 nm, most preferably, 10 nm to 50 nm. The colloidal silica abrasive particles are included in the chemical mechanical polishing composition of the present invention, as an initial component, in amounts of 0.1 wt % to 10 wt %, preferably, 0.5 wt % to 5 wt %, more preferably, 0.5 wt % to 1 wt %, most preferably, 0.5 wt % to 0.8 wt %.

One or more amine carboxylic acids are included in the chemical mechanical polishing composition of the present invention. The one or more amine carboxylic acids have a pI equal to or less than 5, preferably from 2 to 4. Examples of such amine carboxylic acids are aspartic acid (pI=2.77), glutamic acid (pI=3.22), nicotinic acid (pI=3.435) and picolinic acid (pI=3.16). Preferably, the amine carboxylic acid is picolinic acid or nicotinic acid. Most preferably, the amine carboxylic acid is nicotinic acid.

The one or more amine carboxylic acids are included in the chemical mechanical polishing compositions of the present invention, as initial components, in amounts of 0.01 wt % or greater. Preferably, the one or more amine carboxylic acids are included in amounts of 0.01 wt % to 1 wt %, more preferably, the one or more amine carboxylic acids are included in the chemical mechanical polishing composition in amounts of 0.05 wt % to 0.1 wt %, most preferably, from 0.06 wt % to 0.1 wt %.

Optionally, one or more anionic surfactants can be included in the chemical mechanical polishing composition of the present invention. Such anionic surfactants include, but are not limited to, ethoxylated anionic surfactants having a ($C_6$ to $C_{16}$) alkyl, aryl or alkylaryl hydrophobic group, preferably, a ($C_6$ to $C_{10}$) alkyl, aryl or alkylaryl hydrophobic group, preferably, the ethoxylated anionic surfactant is an ethoxylated anionic sulfate surfactant. Examples of preferred anionic sulfate surfactants are ethoxylated alkyl ether sulfates, such as ammonium ether sulfates. Such anionic surfactants are included in the chemical mechanical polishing compositions to reduce roughness of silicon wafers during polishing. An example of a commercially available alkyl ether sulfate surfactant is CEDAPAL® FA-403 ammonium ether sulfate surfactant available from Stepan®.

When one or more anionic surfactants are included in the chemical mechanical polishing composition, they are included, as initial components, in amounts of 0.001 wt % or greater. Preferably, they are included in amounts of 0.001 wt % to 1 wt %, more preferably, from 0.002 wt % to 0.01 wt %, most preferably from 0.003 wt % to 0.01 wt %.

Optionally, one or more biocides can be included in the chemical mechanical polishing compositions. Such biocides include, but are not limited to, KORDEK™ MLX (9.5-9.9% methyl-4-isothiazolin-3-one, 89.1-89.5% water and <1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON and KORDEK are trademarks of The Dow Chemical Company). It is preferred that biocides are included in the chemical mechanical polishing composition.

Biocides can be included in the chemical mechanical polishing composition of the present invention, as an initial component, in amounts of 0.001 wt % to 0.1 wt %, preferably, 0.001 wt % to 0.05 wt %, more preferably, 0.01 wt % to 0.05 wt %, still more preferably, 0.01 wt % to 0.025 wt %.

The chemical mechanical polishing pad used in the chemical mechanical polishing method of the present invention can be any suitable polishing pad known in the art. The chemical mechanical polishing pad can, optionally, be chosen from woven and non-woven to polishing pads. The chemical mechanical polishing pad can be made of any suitable polymer of varying density, hardness, thickness, compressibility and modulus. The chemical mechanical polishing pad can be grooved and perforated as desired. The chemical mechanical polishing composition used in the chemical mechanical polishing method of the present invention enables operation with a low nominal polishing pad pressure, for example at 3 to 35 kPa. Preferably, polishing is done with a platen speed of 93 revolutions per minute, a carrier speed of 87 revolutions per minute, a chemical mechanical polishing composition flow rate of 200 mL/min or 250 mL/min, a nominal down force of 20.7 kPa on a 200 mm or 300 mm polishing machine; and, wherein the chemical mechanical polishing pad comprises a polyurethane polishing layer containing polymeric hollow core microparticles and a polyurethane impregnated non-woven subpad.

The following examples are intended to illustrate the present invention but are not intended to limit its scope.

Example 1

Chemical Mechanical Polishing Compositions

The following chemical mechanical polishing compositions are polishing slurries and were prepared to include the components and amounts disclosed in Table 1 below. Nonionic polymers containing >N—C(═O) functional groups were added to polishing slurries. The components were combined with the balance being deionized water. In addition, each slurry included 0.0167 wt % KORDEK™ (10 wt % methylisothiazolinone in water) biocides. The pH of each slurry was 3.5.

TABLE 1

| Slurry # | Additive | Additive (wt %) | PL-1-D™ Abrasive[1] (wt %) | Nicotinic Acid (wt %) | Ammonium Ether Sulfate[2] (wt %) |
|---|---|---|---|---|---|
| PS-1 | PEO | 0.05 | 0.75 | 0.075 | 0.0031 |
| CS-1 | — | 0 | 0.75 | 0.075 | 0.0031 |
| CS-2 | PVP (Mw = 10,000) | 0.05 | 0.75 | 0.075 | 0.0031 |
| CS-3 | PAAm | 0.05 | 0.75 | 0.075 | 0.0031 |

[1]Anionic colloidal silica abrasive particle available from Fuso Chemical Co., Ltd, Osaka, Japan; and
[2]Cedapal ® FA-403 alkyl ether sulfate anionic surfactant available from Stepan ®

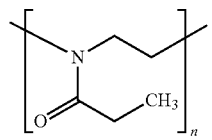

(I)

PEO Structure

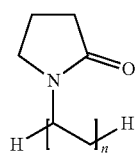

(II)

PVP Structure

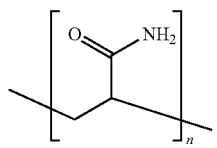

(III)

PAAm Structure wherein "n" is an integer greater than 1.

Example 2

Defect Inhibition

Polishing Conditions:
The following tools were used for polishing experiments:
AMAT Reflexion polisher
IC1000 (1010 grove) pad
Saesol AK45 AM02BSL8031C1 disk
20.7 kPa (3 psi) down-force
93/87 rpm table/carrier speeds
100% in-situ conditioning at 7 lbf pressure
250 mL/min slurry flow rate 300 mm silicon dioxide (TEOS) and LPCVD silicon nitride were used for blanket wafer studies.

Post HF CMP (SP2xp) Defect Counts: Three TEOS wafers were used as defect monitor wafers for each slurry. Each defect wafer was polished for 60s at 3 psi, 93/87 rpm and 250 mL/min slurry flow rate. Wafers were then exposed to a 1.92 wt. % HF solution for a time sufficient to remove 200 A of a given substrate, using a M3307-2949 Veeco™ HF cleaner (Veeco, Horsham, Pa.). Wafers were then scanned on a Surfscan™ SP2xp metrology tool (KLA-Tencor, Milpitas, Calif.) to get Post HF defect wafer maps, followed by automatic SEM review of 100 random defects for scratches, chatter marks, and divots. Klarity defect software (KLA-Tencor, Milpitas, Calif.) was used to extract Post CMP total defect counts for each wafer. Defect counts should be as low as possible. Average value of these three wafers were taken and normalized to that of base line slurry.

TABLE 2

| Slurry # | Post HF Defect # | Extrapolated Scratches + Chatter Marks |
|---|---|---|
| PS-1 | 0.17 | 0.05 |
| CS-1 | 1 | 1 |
| CS-2 | 0.28 | 0.18 |
| CS-3 | 1.45 | 1.36 |

The nonionic polymer containing poly(2-ethyl-2-oxazoline) polymer showed significant defect inhibition over the comparative slurry without a nonionic polymer as well as the comparative slurries which included the nonionic polymers PVP and PAAm.

Example 3

Chemical Mechanical Polishing Compositions

The following chemical mechanical polishing compositions are polishing slurries and were prepared to include the components and amounts disclosed in Table 3 below. The components were combined with the balance being deionized water. In addition, each slurry included 0.0167 wt % KORDEK™ (10 wt % methylisothiazolinone in water) biocides. CS-4 and CS-5 were adjusted to alkaline al values with ammonium hydroxide.

TABLE 3

| Slurry # | Additive | Additive (wt %) | PL-1-D™ Abrasive[1] (wt %) | Nicotinic Acid (wt %) | Ammonium Ether Sulfate[2] (wt %) | pH |
|---|---|---|---|---|---|---|
| PS-2 | PEO | 0.05 | 0.75 | 0.075 | 0.0031 | 3.5 |
| PS-3 | PEO | 0.05 | 0.75 | 0.075 | 0.0031 | 5 |
| CS-4 | PEO | 0.05 | 0.75 | 0.075 | 0.0031 | 8 |
| CS-5 | PEO | 0.05 | 0.75 | 0.075 | 0.0031 | 10.5 |

Example 4

The pH Effect on SiN and TEOS Removal Rate
Polishing Conditions:
The following tools were used for polishing experiments:
Strausbaugh 6EE polisher
IC1000 (1010 grove) pad
Saesol AK45 AM02BSL8031C1 disk
20.7 kPa (3 psi) down-force
93/87 rpm table/carrier speeds 100% in-situ conditioning at 7 lbf pressure
200 mL/min slurry flow rate
200 mm silicon dioxide (TEOS) and PECVD silicon nitride were used for blanket wafer studies.
Removal Rate: Removal rate (RR) was determined from amount removed in one minute polishing. Average value of the three wafers are reported in Table 4. Amount removed was determined from the change in the dielectric film thicknesses before and after polishing using a KLA-Tencor™ FX200 metrology tool (KLA Tencor, Milpitas, Calif.) using a 65 point spiral scan with a 3 mm edge exclusion.

TABLE 4

| Slurry # | pH | SiN RR (Å/min) | TEOS RR (Å/min) | SiN:TEOS RR Ratio |
|---|---|---|---|---|
| PS-2 | 3.5 | 860 | 1 | 860 |
| PS-3 | 5 | 477 | 1 | 477 |
| CS-4 | 8 | 4 | 2 | 2 |
| CS-5 | 10.5 | 15 | 3 | 5 |

The SiN removal rate dropped significantly above pH 5. Accordingly, alkaline pH ranges were shown to be unsuitable for selective polishing of SiN over TEOS.

What is claimed is:

1. An acid chemical mechanical polishing composition, comprising, as initial components:
    water;
    anionic functional colloidal silica abrasive particles;
    a poly(2-ethyl-2-oxazoline) polymer;
    an amine carboxylic acid selected from the group consisting of aspartic acid, glutamic acid, nicotinic acid, picolinic acid and mixtures thereof;
    optionally an anionic surfactant
    optionally a biocide; and,
    wherein a pH of the acid chemical mechanical polishing composition is 5 or less.

2. The acid chemical mechanical polishing composition of claim 1, wherein the chemical mechanical polishing composition comprises, as initial components:
    the water;
    the anionic functional colloidal silica abrasive particles;
    the poly(2-ethyl-2-oxazoline) polymer, wherein the poly(2-ethyl-2-oxazoline) polymer has a weight average molecular weight of 1000 or greater;
    the amine carboxylic acid selected from the group consisting of aspartic acid, glutamic acid, nicotinic acid, picolinic acid and mixtures thereof;
    optionally, the anionic surfactant;
    a biocide; and
    wherein the pH of the chemical mechanical polishing composition is from 2-5.

3. The acid chemical mechanical polishing composition of claim 2, wherein the chemical mechanical polishing composition comprises, as initial components:
    the water;
    0.1 wt % to 10 wt % of the anionic functional colloidal silica abrasive particles;
    0.001 wt % or greater of the poly(2-ethyl-2-oxazoline) polymer, wherein the poly(2-ethyl-2-oxazoline) polymer has a weight average molecular weight of 1000 to 1,000,000;
    the amine carboxylic acid selected from the group consisting of aspartic acid, glutamic acid, nicotinic acid, picolinic acid and mixtures thereof, wherein the amine carboxylic acid has an isoelectric point of less than 5;
    the anionic surfactant;
    the biocide; and
    wherein the pH of the chemical mechanical polishing composition is from 3-5.

4. The acid chemical mechanical polishing composition of claim 3, wherein the chemical mechanical polishing compositions comprises as initial components:
    the water;
    0.5 wt % to 5 wt % of the anionic functional colloidal silica abrasive particles;
    0.005 wt % to 0.25 wt % of the poly(2-ethyl-2-oxazoline) polymer, wherein the poly(2-ethyl-2-oxazoline) polymer has a weight average molecular weight of 10,000 to 500,000;
    0.01 wt % or greater of the amine carboxylic acid selected from the group consisting of aspartic acid, glutamic acid, nicotinic acid, picolinic acid, and mixtures thereof, wherein the amine carboxylic acid has an isoelectric point of less than 5;
    0.001 wt % or greater of the anionic surfactant;
    0.001 wt % to 0.1 wt % of the biocide; and
    wherein the pH of the chemical mechanical polishing composition is from 3-4.

5. A method for chemical mechanical polishing of a substrate, comprising:
    providing a substrate, wherein the substrate comprises silicon nitride and silicon dioxide;
    providing an acid chemical mechanical polishing composition comprising, as initial components:
    water;
    anionic functional colloidal silica abrasive particles;
    a poly(2-ethyl-2-oxazoline) polymer;
    an amine carboxylic acid selected from the group consisting of aspartic acid, glutamic acid, nicotinic acid, picolinic acid, and mixtures thereof;
    optionally, an anionic surfactant;
    optionally, a biocide; and,
    wherein a pH of the acid chemical mechanical polishing composition is 5 or less; and
    providing a chemical mechanical polishing pad with a polishing surface;
    creating dynamic contact at an interface between the polishing surface of the chemical mechanical polishing pad and the substrate with a down force of 20.7 kPa; and
    dispensing the acid chemical mechanical polishing composition onto the chemical mechanical polishing pad at or near the interface between the chemical mechanical polishing pad and the substrate;
    wherein the substrate is polished; and, wherein defects are inhibited and silicon nitride is selectively removed over silicon dioxide from the substrate.

6. The method of claim 5, wherein the acid chemical mechanical polishing composition provided comprises, as initial components:
    water;
    the anionic functional colloidal silica abrasive particles;
    the poly(2-ethyl-2-oxazoline) polymer, wherein the poly(2-ethyl-2-oxazoline) polymer has a weight average molecular weight of 1000 or greater;
    the amine carboxylic acid selected from the group consisting of aspartic acid, glutamic acid, nicotinic acid, picolinic acid and mixtures thereof;
    optionally, the anionic surfactant;
    a biocide; and
    wherein the pH of the acid chemical mechanical polishing composition is from 2-5; and
    providing the chemical mechanical polishing pad with the polishing surface;

creating dynamic contact at the interface between the polishing surface of the chemical mechanical polishing pad and the substrate with a down force of 20.7 kPa; and dispensing the acid chemical mechanical polishing composition onto the chemical mechanical polishing pad at or near the interface between the chemical mechanical polishing pad and the substrate;

wherein the substrate is polished; and, wherein defects are inhibited and silicon nitride is selectively removed over silicon dioxide from the substrate.

7. The method of claim 6, wherein the acid chemical mechanical polishing composition comprises, as initial components:

water;
0.1 wt % to 10 wt % of the anionic functional colloidal silica abrasive particles;
0.001 wt % or greater of the poly(2-ethyl-2-oxazoline) polymer, wherein the poly(2-ethyl-2-oxazoline) polymer has a weight average molecular weight of 1000 to 1,000,000;
the amine carboxylic acid selected from the group consisting of aspartic acid, glutamic acid, nicotinic acid, picolinic acid and mixtures thereof, wherein the amine carboxylic acid has an isoelectric point of less than 5;
the anionic surfactant;
the biocide; and
wherein the pH of the acid chemical mechanical polishing composition is from 3-5; and providing the chemical mechanical polishing pad with the polishing surface;

creating dynamic contact at the interface between the polishing surface of the chemical mechanical polishing pad and the substrate with a down force of 20.7 kPa; and dispensing the acid chemical mechanical polishing composition onto the chemical mechanical polishing pad at or near the interface between the chemical mechanical polishing pad and the substrate;

wherein the substrate is polished; and, wherein defects are inhibited and silicon nitride is selectively removed over silicon dioxide from the substrate.

8. The method of claim 7, wherein the acid chemical mechanical polishing composition comprises, as initial components:

water;
0.5 wt % to 5 wt % of the anionic functional colloidal silica abrasive particles;
0.005 wt % to 0.25 wt % of the poly(2-ethyl-2-oxazoline) polymer, wherein the poly(2-ethyl-2-oxazoline) polymer has a weight average molecular weight of 10,000 to 500,000;
0.01 wt % or greater of the amine carboxylic acid selected from the group consisting of aspartic acid, glutamic acid, nicotinic acid, picolinic acid and mixtures thereof, wherein the amine carboxylic acid has an isoelectric point of less than 5;
0.001 wt % or greater of the anionic surfactant;
0.001 wt % to 0.1 wt % of the biocide; and
wherein the pH of the acid chemical mechanical polishing composition is from 3-4; and providing the chemical mechanical polishing pad with the polishing surface;

creating dynamic contact at the interface between the polishing surface of the chemical mechanical polishing pad and the substrate with a down force of 20.7 kPa; and dispensing the acid chemical mechanical polishing composition onto the chemical mechanical polishing pad at or near the interface between the chemical mechanical polishing pad and the substrate;

wherein the substrate is polished; and, wherein the defects are inhibited and silicon nitride is selectively removed over silicon dioxide from the substrate.

* * * * *